(12) United States Patent
Wong

(10) Patent No.: US 6,731,539 B1
(45) Date of Patent: May 4, 2004

(54) MEMORY WITH OFFSET BANK SELECT CELLS AT OPPOSITE ENDS OF BURIED DIFFUSION LINES

(76) Inventor: Sau Ching Wong, 30 Sugar Hill Dr., Hillsborough, CA (US) 94010

( * ) Notice: Subject to any disclaimer, the term of this patent is extended or adjusted under 35 U.S.C. 154(b) by 5 days.

(21) Appl. No.: 10/407,894

(22) Filed: Apr. 4, 2003

Related U.S. Application Data

(62) Division of application No. 09/839,973, filed on Apr. 20, 2001, now Pat. No. 6,570,810.

(51) Int. Cl.[7] .................................. G11C 16/04
(52) U.S. Cl. .................. 365/185.11; 365/230.03
(58) Field of Search .................. 365/185.11, 185.14, 365/185.28, 230.03, 230.04, 230.06, 104

(56) References Cited

U.S. PATENT DOCUMENTS

| | | |
|---|---|---|
| 5,117,389 A | 5/1992 | Yiu |
| 5,204,835 A | 4/1993 | Eitan |
| 5,268,861 A | 12/1993 | Hotta |
| 5,399,891 A | 3/1995 | Yiu et al. |
| 5,517,448 A | 5/1996 | Liu |
| 5,526,307 A | 6/1996 | Yiu et al. |
| 5,561,624 A * | 10/1996 | Chen et al. .............. 365/104 |
| 5,621,697 A | 4/1997 | Weng et al. |
| 5,633,185 A | 5/1997 | Yiu et al. |
| 5,691,938 A | 11/1997 | Yiu et al. |
| 5,717,636 A | 2/1998 | Dallabora et al. |
| 5,822,242 A | 10/1998 | Chen |
| 5,837,584 A | 11/1998 | Lu et al. |
| 5,959,892 A | 9/1999 | Lin et al. |
| 6,009,013 A | 12/1999 | Van Houdt et al. |
| 6,037,226 A | 3/2000 | Ra |
| 6,084,794 A * | 7/2000 | Lu et al. .............. 365/104 |
| 6,121,670 A | 9/2000 | Hisamune |
| 6,130,452 A | 10/2000 | Lu et al. |
| 6,175,519 B1 | 1/2001 | Lu et al. |

OTHER PUBLICATIONS

Woo et al., A Novel Memory Cell using Flash Array Contactless EPROM (FACE) Technology, IEDM 90, (1990), pp. 5.1.1–5.1.4.

* cited by examiner

*Primary Examiner*—Richard Elms
*Assistant Examiner*—Anh Phung

(57) ABSTRACT

A compact contactless Flash memory architecture has memory cells instead of isolation regions between adjacent diffused lines in rows of a bank and thereby increases the density of memory cells in the bank when compared to prior architectures. Diffused lines in the bank can be used as virtual ground lines or as bit lines depending on which column of the bank is selected for access. The architecture includes about half as many metal lines as diffused lines, and most bank select cells operate to connect respective metal lines to respective pairs of diffused lines.

7 Claims, 9 Drawing Sheets

MEMORY WITH OFFSET BANK SELECT CELLS AT OPPOSITE ENDS OF BURIED DIFFUSION LINES

CROSS-REFERENCE TO RELATED PATENT APPLICATION

This application is a divisional of application Ser. No. 09/839,973, filed Apr. 20, 2001, now U.S. Pat. No. 6,570,810 issued on May 27, 2003.

BACKGROUND

A conventional contactless Flash memory array employs bit lines and source lines that are diffused into a silicon substrate. FIG. 1A conceptually illustrates the layout of part of a bank 100 in a conventional contactless Flash memory. In bank 100, n+ diffusion into a silicon substrate forms diffused bit lines 110 and diffused source (or ground) lines 120. Polysilicon floating gates 130 (poly 1) overlie channel regions, which are between diffused bit lines 110 and diffused source lines 120. Polysilicon word lines 140 (poly 2) cross over portions of diffused bit lines 110 and diffused source lines 120 that form the drains and sources of memory cells and also overlie associated floating gates 130.

FIG. 1B shows a cross section along a word line 140 in bank 100. As shown in FIG. 1B, channel regions 115 in the silicon substrate separate drain regions of diffused bit lines 110 from source regions of diffused source lines 120. Floating gates 130 overlie respective channel regions 115, with a gate insulator (e.g., gate oxide layer) between floating gates 130 and underlying channel regions 115. Word lines 140 overlie floating gates 130 with an insulating layer between each word line 140 and the underlying float gates 130 that are in a row corresponding to the word line.

Isolation structures 125 such as shallow trench isolation (STI) regions, conventional field oxide (LOCOS) regions, or heavily doped p+ field implant regions separate adjacent diffused lines 110 from each other. Similar isolation structures (not shown) also separate adjacent channel regions 115 from each other.

As shown in FIG. 1A, each diffused bit line 110 extends to an associated bank select cell 170. Bank select cells 170 include transistors between respective diffused bit lines 110 and contacts to respective metal bit lines 180 that are typically part of a first metal layer and that overlies corresponding diffused bit lines 110. Generally, each metal bit line 180 extends over a number of banks and is connected to a corresponding select cell in each of the banks. A bank select line 160 controls bank select cells 170 in the bank to determine whether diffused bit lines 110 in the bank are connected to respective metal bit lines 180.

Diffused source lines 120 extend to contact virtual ground devices (not shown) or to other structures for control of the voltages of diffused source lines 120 during erase, write, and read operations.

A memory cell 150 in bank 100 of FIG. 1A includes a single floating gate transistor, and the number of memory cells in bank 100 is equal to the number of floating gates 130. In operation, charge added to or removed from the floating gate 130 in a memory cell 150 during a program or erase operation changes the threshold voltage of the floating gate transistor in the memory cell 150. The binary value stored in a memory cell 150 depends on whether the memory cell 150 is in a state having a high threshold voltage or a low threshold voltage.

The layout of each memory cell 150 in the contactless Flash memory array of FIG. 1A includes areas for a floating gate transistor and surrounding isolation structures. To minimize the area of a memory cell, features in the memory cells have widths or lengths equal to the minimum feature size, f, permitted by the design rules governing manufacture of the Flash memory integrated circuit. Along the direction perpendicular to diffused bit lines 110, the features for a memory cell include a shared isolation structure 125, a drain region of diffused bit line 110, a channel region 115, and a shared source region of diffused source line 120 as illustrated in FIG. 1B. The width and length of each of these structures are at least as wide or long as the minimum feature size f. Accordingly, a memory cell has an overall length (counting half the size of the shared features 120 and 125) of about 3f. The overall width of the memory cell area includes the width of the associated word line 140 and half of the widths of two adjacent isolation structures or at least 2f. The minimum memory cell area is thus about $6f^2$ ($3f \times 2f$).

The effective memory cell size for bank 100 must additionally include a pro-rata portion of integrated circuit area associated with required overhead circuitry such as bank select cells 170, source contacts (not shown), and any virtual ground structures. More specifically, in one architecture M cells on a diffused bit line 110 share one bank select cell 170, the effective size of each memory cell is greater than $6f^2$ by 1/M times the area of a bank select cell and any other overhead for the column.

A contactless memory architecture that reduces the required cell area could increase the storage density achieved in a Flash memory integrated circuit (IC) and could therefore decrease the cost of Flash memory ICs.

SUMMARY

In accordance with an aspect of the invention, a contactless memory architecture has diffused lines that operate either as diffused bit lines or diffused source lines depending on the voltage through bank select cells to the diffused lines. Word lines crossing the diffused lines have underlying floating gates and channel regions between each pair of adjacent diffused lines, and no isolation structures are required between adjacent diffused lines. Elimination of these isolation structures significantly reduces the minimum cell area and permits a higher density of memory cells within a bank.

In the exemplary embodiment, each bank includes two sets of bank select cells, typically at opposite ends of the diffused lines. Each bank select cell except some corresponding to diffused lines at edges of a bank connect an associated metal line to a pair of diffused lines. One set of bank select cells connects the metal lines to pairs of diffused lines that are shifted relative to the pairs of diffused lines that the other set of bank select cells connect to the metal lines. For any pair of adjacent diffused lines, activating one set of the bank select cells connects both of the adjacent diffused lines to the same metal line, and activating the other set of the bank select cells connects the two adjacent diffused lines to different metal lines.

The metal lines act either as bit lines or as ground lines depending on which column of memory cells an access operation selects. The layout of the metal lines across a set of banks generally includes a zigzag pattern to accommodate the relative shift of the bank select cells at opposite ends of each bank, but other layouts are possible.

An access to a memory cell in a selected column biases metal lines to one side (e.g., the left) of a selected column of memory cells at a first voltage and biases metal lines on the other side (e.g., to the right) of the selected column of memory cells at a second voltage. The appropriate set of bank select cells is activated for the access to achieve a voltage difference between the pair of adjacent diffused lines associated with the selected column. The resulting drain/source voltage difference of the memory cells in the selected column permits access of the selected memory cell in the selected column, and the common voltages on all other pairs of adjacent diffused lines prevent access or significant disturbance of memory cells in unselected columns.

One embodiment of the invention is a bank of a memory such as a Flash memory. The bank includes memory cells arranged in rows and columns. Each memory cell includes a channel region in a substrate, a floating gate overlying the channel region, and a control gate overlying the floating gate. Diffused lines in the bank have portions that form source/drain regions of the memory cells, and every area of the substrate that is between an adjacent pair of the diffused lines contains the channel regions of memory cells that form a column in the bank.

The bank can additionally include first bank select cells and second bank select cells. Each first bank select cell includes a transistor between a corresponding adjacent pair of the diffused lines and a corresponding metal line. Each second bank select cell includes a transistor between a corresponding adjacent pair of the diffused lines and a corresponding one of the metal lines, but the adjacent pairs of diffused lines corresponding to the second bank select cells are offset relative to the adjacent pairs of diffused lines corresponding to the first bank select cells. Additionally, one first bank select cell may be connected to a single diffused line, e.g., the first diffused line in the bank, and one second bank select cell may be connected to a single diffused line, e.g., the last diffused line in the bank.

Another embodiment of the invention is a memory including multiple banks and metal lines connected to the banks. Each bank includes: diffused lines in a substrate; channel regions arranged in rows and columns; floating gates respectively overlying the channel regions; word lines respectively overlying rows of the channel regions; first bank select cells; and second bank select cells. In each bank, each area of the substrate that is between an adjacent pair of the diffused lines contains a column of channel regions. The first bank select cells that are coupled to pairs of the diffused lines as are the second bank select cells, but the pairs of diffused lines coupled to the second bank select cells are offset relative to the pairs of diffused lines coupled to the first bank select cells.

Metal lines connect to respective first bank select cells and respective second bank select cells in each bank. Generally, the memory further includes column decoding circuitry coupled to bias the metal lines for an access of a selected memory cell. One embodiment of the invention includes thermometer-type column decoders in addition to conventional column decoders, drivers, sense amplifiers, and programming circuits. In response to a column address signal for the access, the thermometer-type column decoders bias all metal lines connected to diffused lines to a first side of the selected memory cell at a first voltage and biases all metal lines connected to diffused lines to a second side of the selected memory cell at a second voltage. Typically, the first voltage is ground, and the second voltage is positive and at a level required for a write or a read operation. The conventional column decoding circuits connect sense amplifier and programming circuits to the metal lines associated with the selected column.

BRIEF DESCRIPTION OF THE DRAWINGS

Use of the same reference symbols in different figures indicates similar or identical items.

DETAILED DESCRIPTION

In accordance with an aspect of the invention, a contactless memory architecture with buried diffusion bit/virtual ground lines reduces memory cell size by having memory cells between every pair of adjacent diffused lines and eliminating isolation structures that are between adjacent diffused bit lines in prior contactless Flash memories. In an exemplary embodiment of the invention, each diffused line can act as a diffused bit line or a diffused source line depending on which column of memory cells is selected. Two sets of bank select cells allow selection of either an odd or even column of memory cells for an access such as a write or read operation. Metal lines connect to the diffused lines via the bank select cells and bias the diffused lines as required for the access operation on the selected column.

Figure 2A:
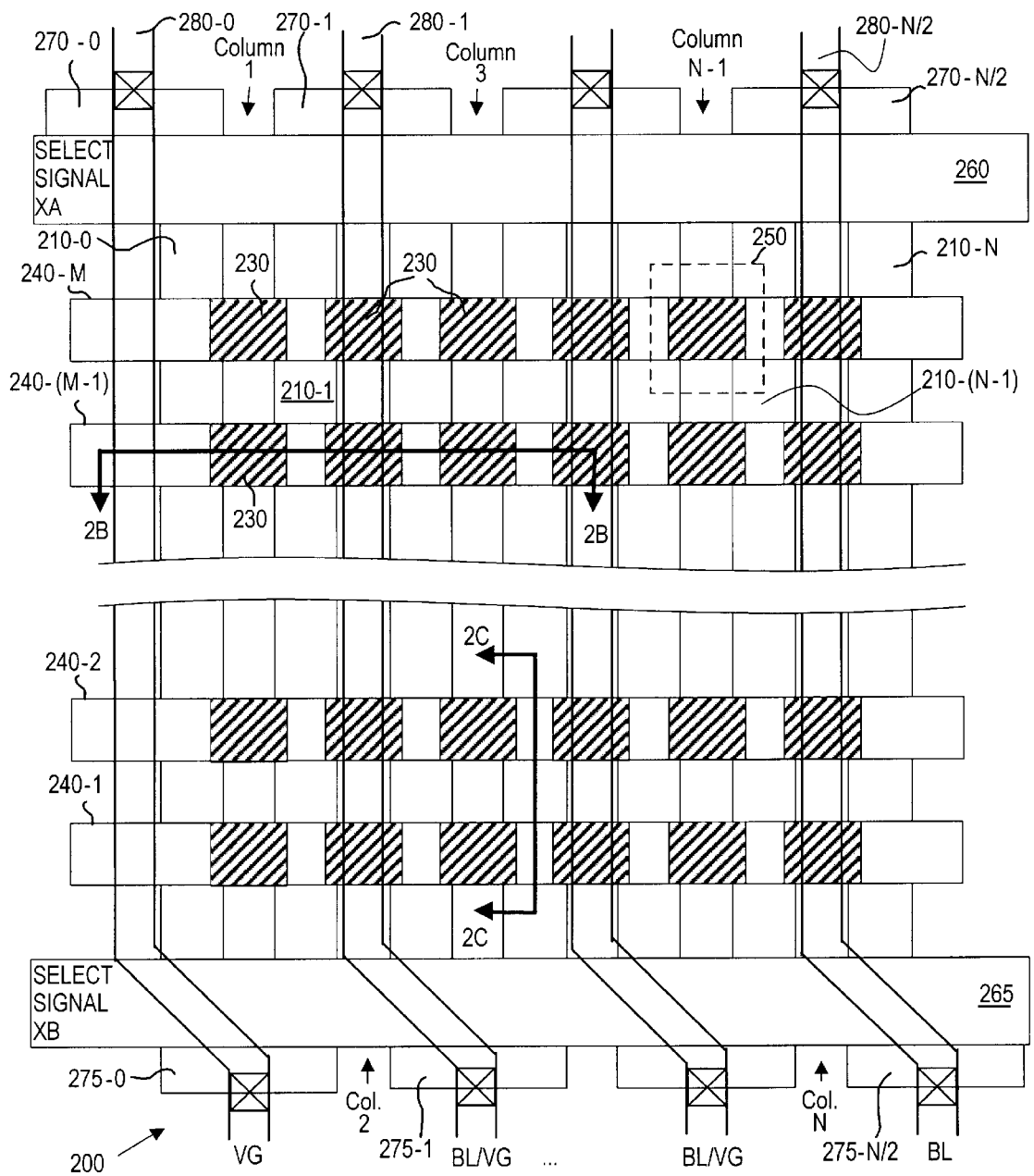
FIG. 2A shows a layout of a contactless Flash memory array in accordance with an embodiment of the invention.

FIG. 2A shows the layout of an M-by-N bank 200 of contactless Flash memory cells 250 in accordance with an embodiment of the invention. In a typical bank, the number of rows M is 64, and the number of columns N could be up to 1024 or more for high-density memory. The bank includes N+1 diffused lines 210-0 to 210-N, generically referred to herein as diffused lines 210, and M word lines 240-1 to 240-M, generically referred to herein as word lines 240. Diffused lines 210 are in a p-well inside a deep n-well of an underlying p-type substrate and run in the direction of the N columns in bank 200. Word lines 240 are part of an overlying conductive layer (typically a second polysilicon layer) and run in the directions of the M rows of bank 200.

Portions of diffused lines 210 that are under word lines 240 form source/drain regions of floating gate transistors in respective memory cells 250. Each memory cell 250 further includes a channel region and a floating gate 230. The channel regions are in the p-well and between the associated source/drain regions of diffused lines 210, and floating gates 230 are between respective channel regions and associated word lines 240. Each floating gate 230 corresponds to a different memory cell 250 and is charged according to the value stored in the corresponding memory cell.

Figure 2B:
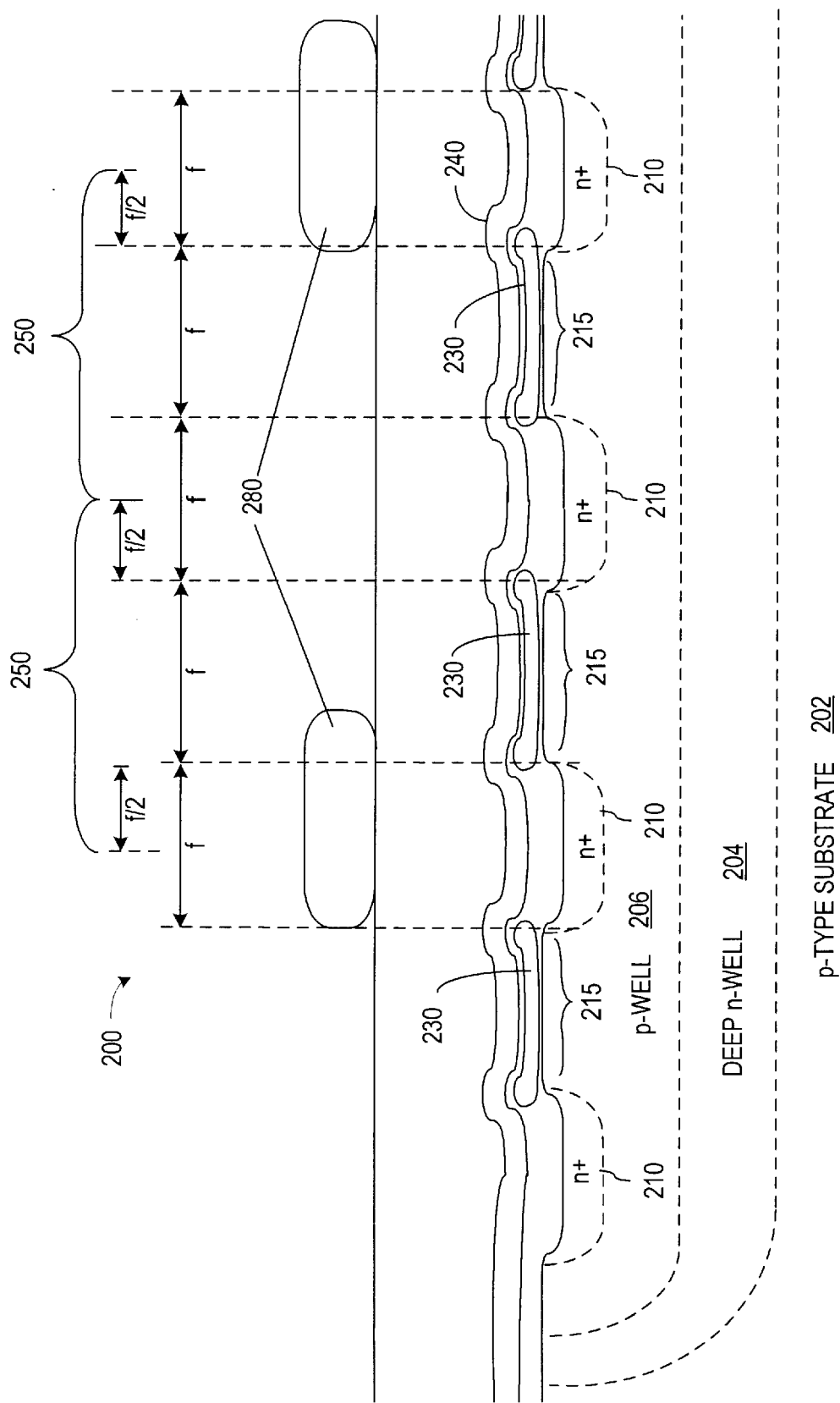
FIGS. 2B and 2C show cross sections respectively in column and row directions in the contactless Flash memory array of FIG. 2A.

FIG. 2B shows a cross section of bank 200 that is parallel to and through a diffused line 210 formed in a semiconductor substrate. In the exemplary embodiment, the semiconductor substrate is a p-type substrate 202 containing a p-well 206 inside a deep n-well 204. Deep n-well 204 and p-well 206 have contacts (not shown) that permit independent biasing.

Diffused lines 210 are regions of n+ doping in p-well 206. Diffused lines 210 can be formed of salicide that is buried in the semiconductor substrate 202 to reduce the resistance of diffused lines 210. Formation of salicide for diffusion regions is well known for high-speed logic and memory processes, including contactless Flash memory arrays.

Figure 2C:
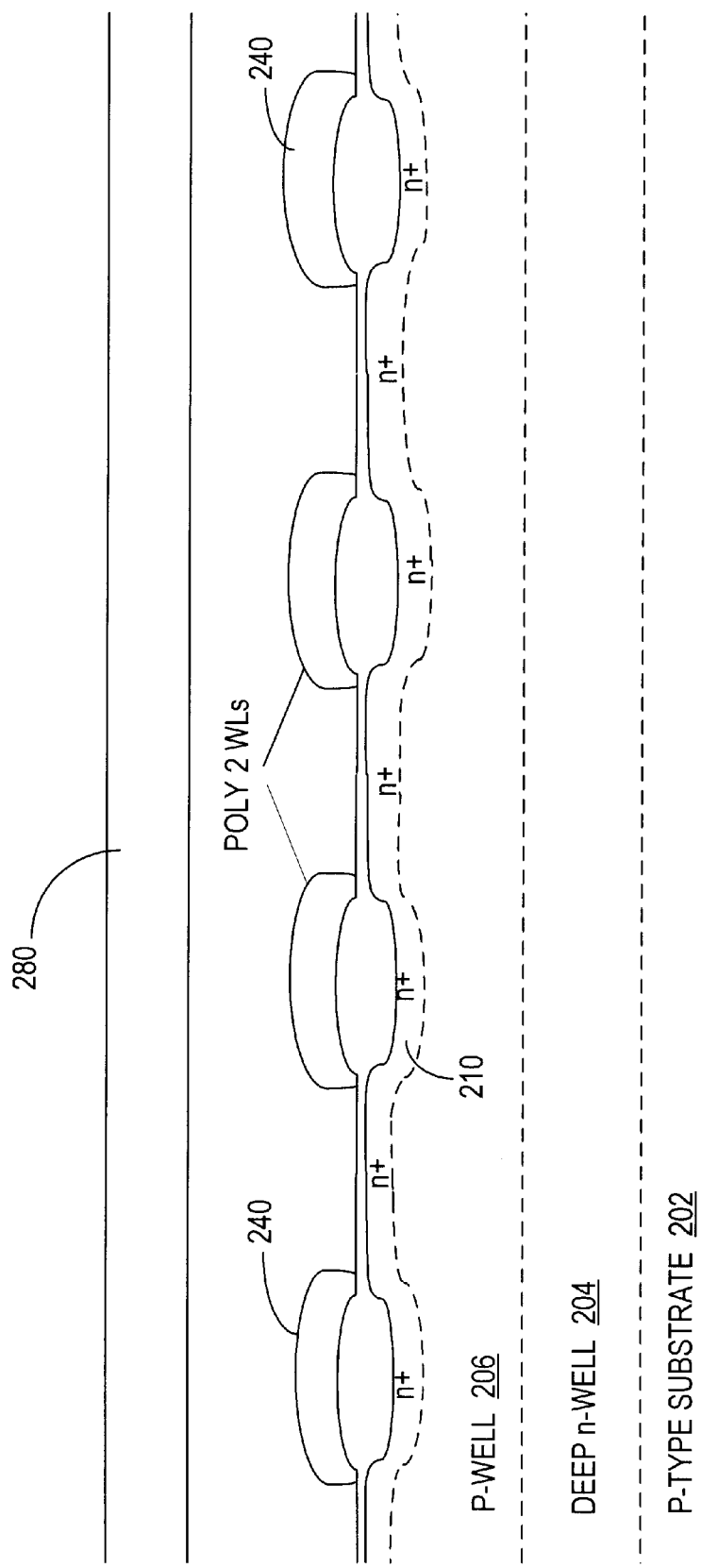

FIG. 2C shows a cross section of bank 200 that is parallel to and through a word line 240 and a diffused line 210. Diffused lines 210, which are formed before the second polysilicon (Poly2) layer during IC fabrication, cross under word lines 240, and portions of the diffused lines 210 that are under word lines 240 form source/drain regions of memory cells.

Returning to FIG. 2B, channel regions 215 are between diffused lines 210 and particularly between portions of diffused lines 210 that form n+ source/drain regions under word lines 240. Unlike prior contactless Flash memories, no isolation structures are under word lines 240 to separate adjacent diffused lines. Isolation structures such as shallow trench isolation, field oxide isolation, or heavily doped p+ field implant regions (not shown) separate channel regions 215 that are in the same column of bank 200, i.e., between the same pair of diffused lines 210.

Floating gates 230 are typically from a first polysilicon layer, and a thin gate insulator such as a gate oxide layer separates the floating gates 230 from respective channel regions 215. Patterning of a second polysilicon layer forms word lines 240 that are over floating gates 230 with an insulating layer, typically an oxi-nitride-oxide (ONO) layer, between word lines 240 and the underlying floating gates 230.

Figure 1A:
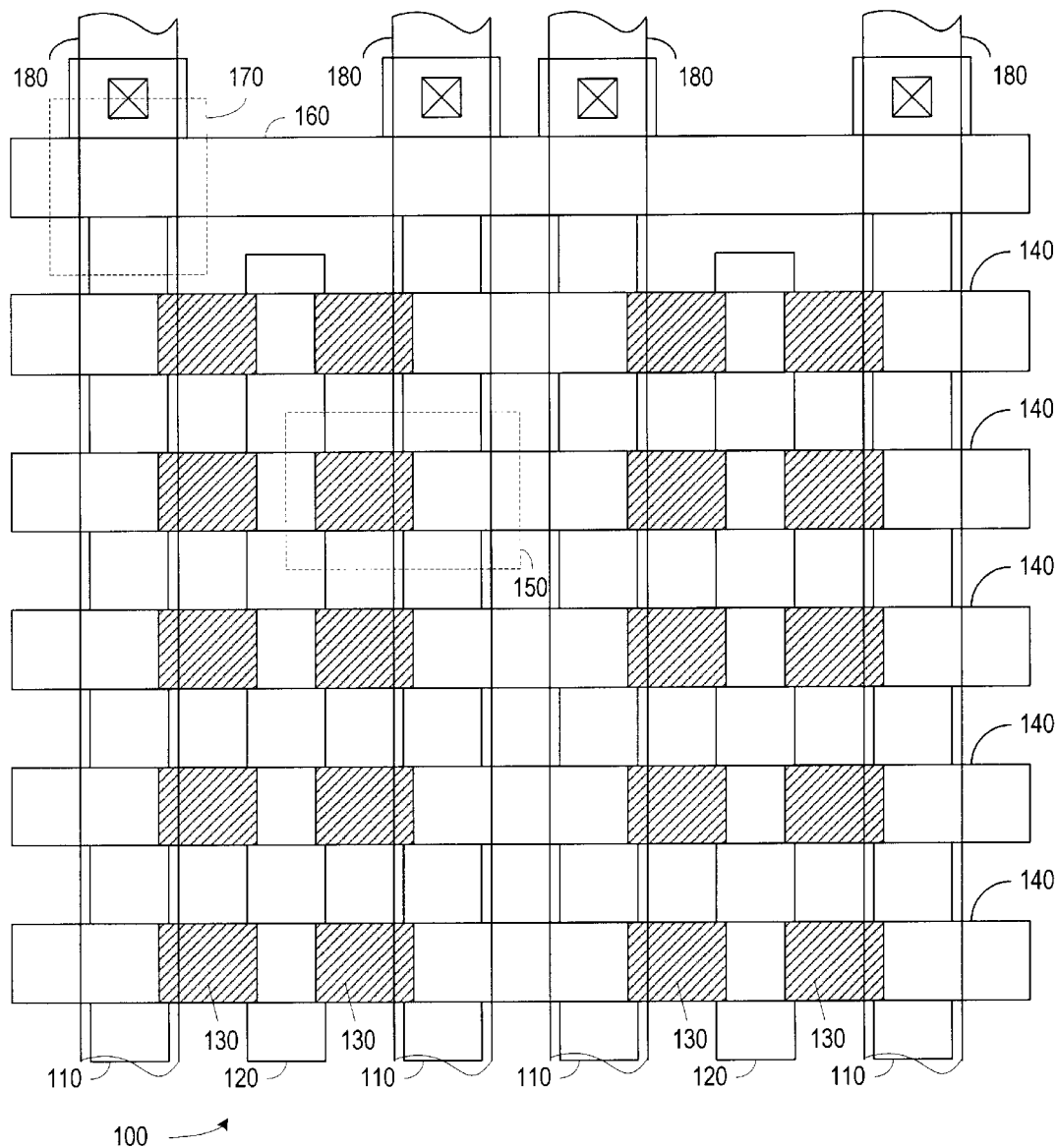
FIGS. 1A and 1B respectively illustrate a conceptual layout and a cross section of a conventional contactless Flash memory array with buried diffusion bit lines and source lines.
Figure 1B:
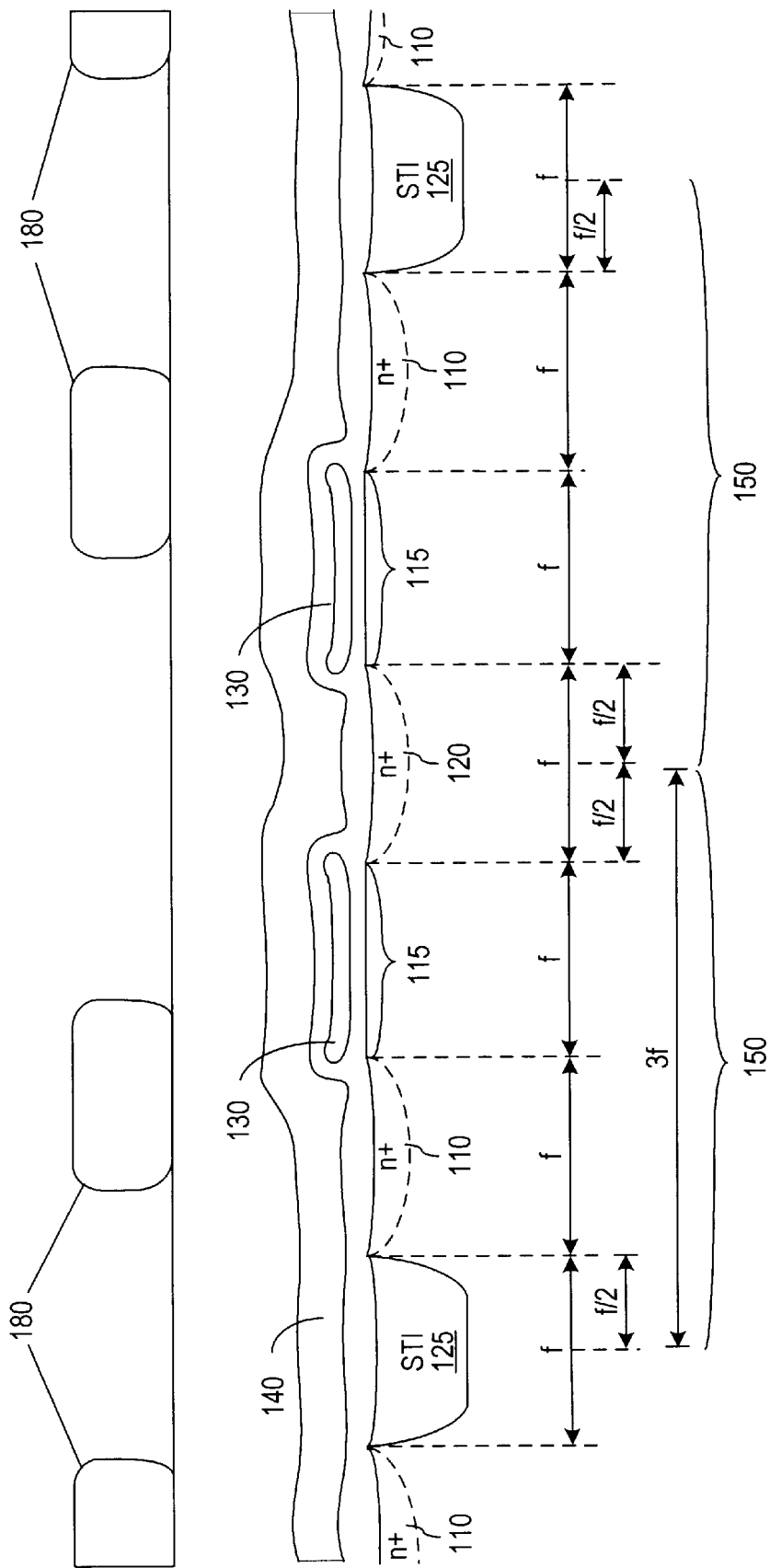

Memory cells 250 in this embodiment of the invention are more compact than prior contactless Flash memories because adjacent memory cells 250 share both source/drain regions and isolation structures 125 (FIG. 1B) are eliminated. In particular, if the channel length of each channel 215 and the width of each diffused line is equal to the minimum feature size f, each memory cell 250 has a width of 2f, and the resulting memory cell area is $4f^2$ (2f×2f). The prior memory cells 150 as illustrated in FIG. 1B are thus 50% larger than memory cells 250.

As shown in FIG. 2A, N/2+1 metal lines 280-0 to 280-N/2 respectively connect to N/2+1 bank select cells 270-0 to 270-N/2 and N/2+1 bank select cells 275-0 to 275-N/2, which are generically referred to as bank select cells 270 and 275. Bank select cells 270 are at the ends of diffused lines 210 opposite to the ends connected to bank select cells 275. Excluding bank select cells 270-0 and 275-N/2, which are at edges of bank 200, each bank select cell 270 or 275 operates as a switch between the respective metal line 280 and a pair of adjacent diffused lines 210.

Connections of bank select cells 270 to respective diffused lines 210 are staggered relative to the connections of bank select cells 275 to respective diffused lines 210. More specifically, bank select cell 270-0 is between metal line 280-0 and diffused line 210-0. Bank select cell 275-0 is between metal line 280-0 and a pair of diffused lines 210-0 and 210-1. Bank select cell 270-1 is between metal line 280-1 and a pair of diffused lines 210-1 and 210-2, and bank select cell 275-1 is between metal line 280-1 and a pair of diffused lines 210-2 and 210-3. This pattern continues up to bank select cell 270-N/2, which is between metal line 280-N/2 and diffused lines 210-(N−1) and 210-N, and bank select cell 275-N/2, which is between metal line 280-N/2 and diffused line 210-N.

Bank select lines 260 and 265, which can be formed from the layer (typically poly2) forming word lines 240, respectively control bank select cells 270 and 275. Activation of a select signal XA on bank select line 260 simultaneously turns on all bank select cells 270 in bank 200, so that bank select cells 270 electrically connect metal lines 280 to diffused lines 210. Activation of a bank select signal XB on bank select line 265 simultaneously turns on all bank select cells 275 in bank 200, and bank select cells 275 electrically connect metal lines 280 to diffused lines 210.

Figure 2D:
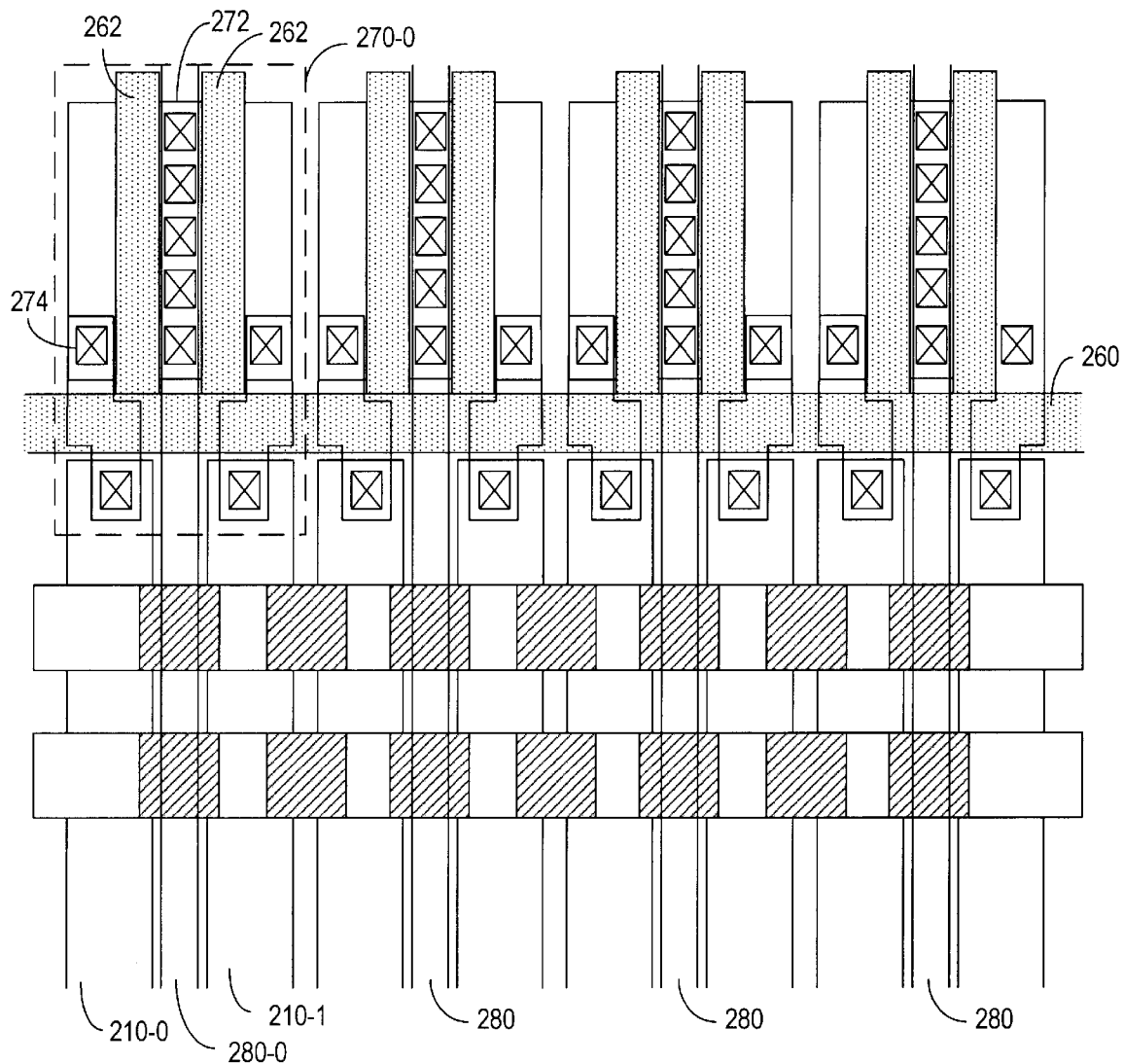
FIG. 2D illustrates a layout for a bank selection cell for the contactless Flash memory array of FIG. 2A.

FIG. 2D shows an exemplary layout of a bank select cell 270. For faster response in charging of diffused lines 210, bank select cells 270 require a channel width that may be too large to be accommodated in the very small pitch of the columns of bank 200. Accordingly, gates 262 extend from bank select line 260 over channels of bank select cell 270. Each metal line 280 connects through one or more contacts to a drain region 272 in a central portion of the respective bank select cell 270. The channel regions under gates 262 separate each drain region 272 from associated source regions 273, and metal interconnects 274 contact source regions 273 and associated diffused lines 210.

Bank select cells 275 have a structure similar or identical to bank select cells 270. An adjacent bank (not shown) that is below bank 200 in FIG. 2A can be mirror-symmetric so that bank select cells 275 in the adjacent banks share contacts to metal lines 280. Similarly, an adjacent bank (not shown) that is above bank 200 in FIG. 2A can be mirror-symmetric so that bank select cells 270 in the adjacent banks share contacts to metal lines 280.

When accessing a memory cell in bank 200 of FIG. 2A, decoding circuitry (not shown) activates one of select signals XA and XB. In particular, when an address signal identifies a memory cell in bank 200, column decoding circuitry (not shown) activates select signal XA when the memory cell being access is in an odd-numbered column 1, 3, . . . , N−1 and alternatively activates bank select signal XB when the memory cell being access is in an even-numbered column 2, 4, . . . , N.

Figure 3A:
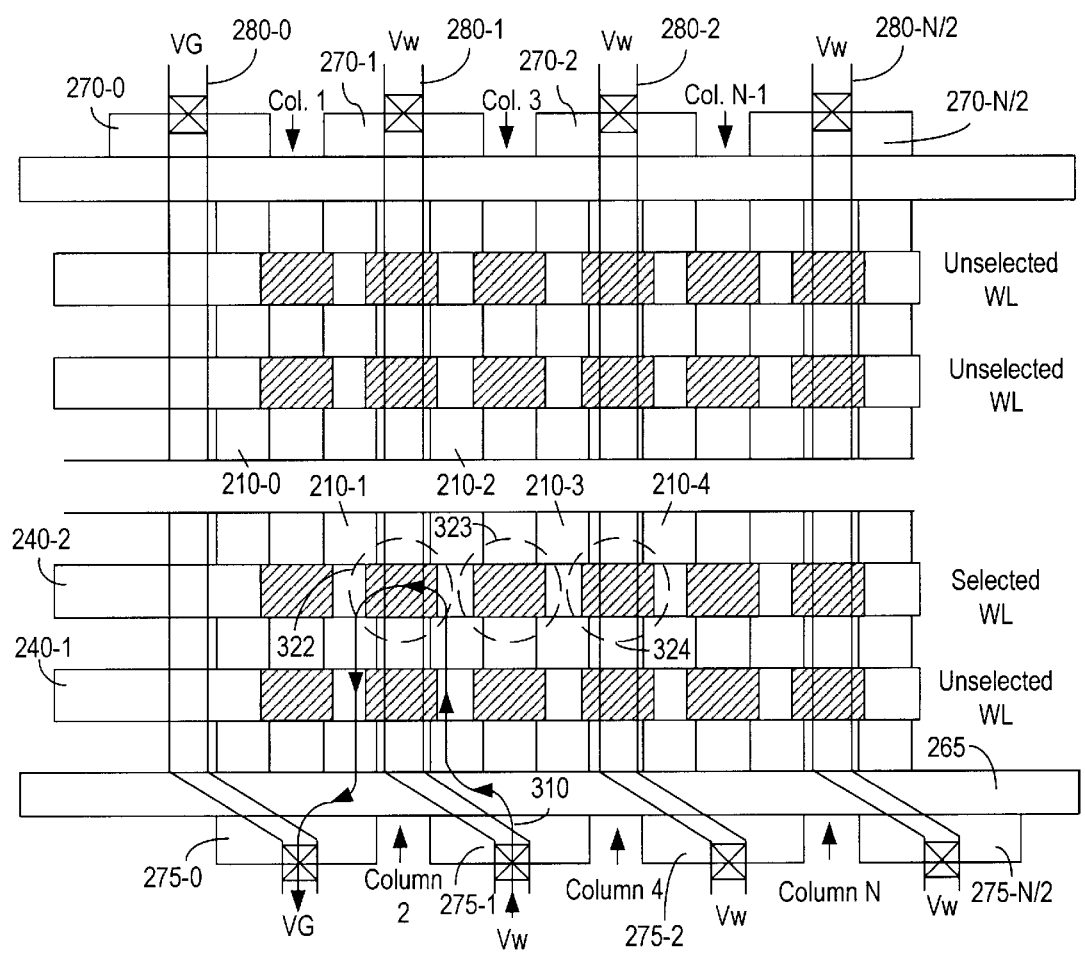
FIGS. 3A and 3B illustrate operations accessing memory cells in selected columns of the contactless bank of FIG. 2A.

FIG. 3A illustrates a write operation that uses channel hot electron injection to program a selected memory cell 322, which is in the second row and second column of bank 200. The timing for a programming operation is described further below, but during the programming operation, conventional row decoders and drivers (not shown) drive the selected word line 240-2 at a word line programming voltage Vpp, typically about 9 to 12 volts, depending on the target threshold voltage for the programming, the memory cell device characteristics, and the programming time budget. Unselected word lines 240 are biased low (e.g., grounded).

Bank select circuitry activates bank select signal XB on bank select line 265 to turn on bank select cells 275 in response to an address signal indicating that selected memory cell 322 is in an even column (column 2) of bank 200. As a result, bank select cells 275 connect metal lines 280-0 and 280-1 respectively to diffused lines 2.10-1 and 210-2, which are on opposite si of selected memory cell 322. The select signal XA on bank select line 260 is deactivated to turn off bank select cells 270.

Column decoding and drive circuits (not shown) drive metal line 280-0 to a low voltage (typically ground) and drive metal line 280-1 to a programming voltage Vw (typically about 4.5 to 6 volts) depending on the target threshold voltage for the programming, the memory cell device characteristics, and the programming time budget. Since the selected word line 240-2 is at a high voltage and turns on selected memory cell 322, a current 310 flows from metal line 280-1 to metal line 280-0 through bank select cell 275-1, diffused line 210-2, the channel 2 selected memory cell 322, diffused line 210-1, and bank select cell 275-0. Current 310 through channel region 215 of selected memory cell 322 causes channel hot electron injection into the floating gate 230 of selected memory cell 322 and raises the threshold voltage of selected memory cell 322.

During programming, bank select cell 275-1 also applies programming voltage Vw from metal line 280-1 to diffused lines 210-2 and 210-3. An unselected memory cell 323, which is in the selected row and between diffused lines 210-2 and 210-3, is not programmed because both source/drain regions of unselected memory cell 323 are at substantially the same voltage and no significant current flows through unselected memory cell 323.

An unselected memory cell 324, which is in the selected row and between diffused lines 210-3 and 210-4, has a source/drain region portion in diffused line 210-3 at programming voltage Vw and a corresponding word line 240-2 at programming voltage Vpp. To prevent programming of unselected cell 324, column decoding and virtual ground/bit line (VG/BL) bias circuits raise metal line 280-2 to the programming voltage and thereby charges diffused line 210-4 via metal line 280-2 and bank select cell 275-2 to programming voltage Vw. Both source/drain regions of unselected cell 324 being at substantially the same voltage prevents programming of unselected cell 324.

The column decoding and VG/BL bias circuits prevent programming of all unselected memory cells that are in the selected row by biasing all metal lines and diffused lines on one side of the selected memory cell to the low voltage (virtual ground VG) and biasing all metal lines and diffused lines on the other side of selected memory cell to programming voltage Vw. In the particular example of FIG. 3A, column select and driver circuits ground metal line 280-0 and bias metal lines 280-1 to 280-N/2 to programming voltage Vw. With select signal XB activated, diffused lines 210-0 and 210-1 are at virtual ground VG, and diffused lines 210-2 to 210-N are at programming voltage Vw.

Figure 3B:
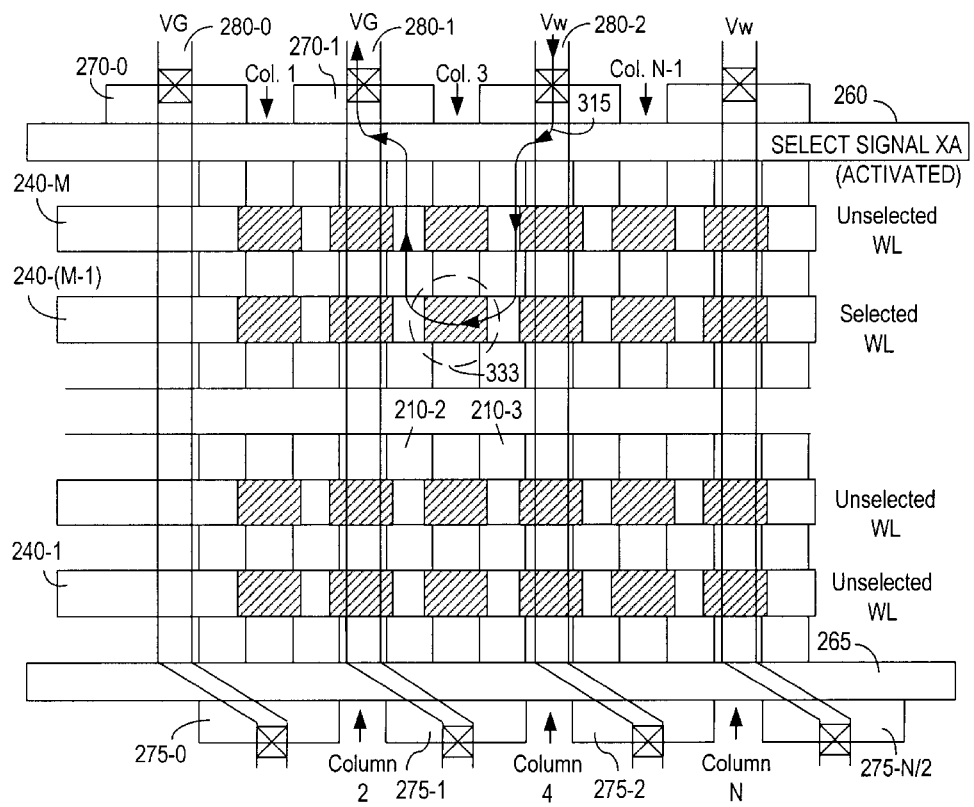

FIG. 3B illustrates a program operation when a selected memory cell 333 is in an odd column (column 3). For programming, the memory raises the selected word line 240-(M−1) to the word line programming voltage Vpp, grounds diffused line 210-2, and raises diffused line 210-3 to programming voltage Vw. To bias diffused lines 210, bank select logic activates the select signal XA on bank select line 260, and column decoders and VG/BL bias circuits ground metal lines 280-1 to 280-0 (i.e., metal lines to the left of selected cell 333) and bias metal lines 280-2 to 280-N/2 to programming voltage Vw. The bank select signal KB on bank select line 265 is deactivated to prevent connection of diffused lines 210-2 and 210-3 to the same metal line 280-1.

In the same manner as described above in regard to FIG. 3A, a current 315 flows from metal line 280-2 to metal line 280-1 through bank select cell 270-2, diffused line 210-3, the channel 215 of the selected cell 333, diffused line 210-2, and bank select cell 270-1. Channel hot electron injection thus programs selected cell 333. Other memory cells in the selected row are not programmed because the unselected cells have substantially the same voltage (e.g., virtual ground VG or programming voltage Vw) on both source/drain regions.

For a write operation that does not program the selected memory cell, i.e., when the data input bit is 0 so that the cell is left in its "virgin" or unprogrammed state, the selected word line is biased at programming voltage Vpp, but all metal lines 280 are grounded or floating.

Table 1 illustrates the biasing of bank select lines 260 and 265 and metal lines 280 for an access of various columns of bank 200. As shown in Table 1, in the exemplary embodiment, metal line 280-0 is always grounded for an access operation, and metal line 280-N/2 is always at a positive voltage for the access operation.

TABLE 1

Bank Select and Metal Line Biasing for Programming (Data In = "1")

| | Selected column | | | | | |
|---|---|---|---|---|---|---|
| | 1 | 2 | 3 | 4 | ... N-1 | N |
| XA (260) | High | Low | High | Low | High | Low |
| XB (265) | Low | High | Low | High | Low | High |
| 280-0 | Ground | Ground | Ground | Ground | Ground | Ground |
| 280-1 | Vw | Vw | Ground | Ground | Ground | Ground |
| 280-2 | Vw | Vw | Vw | Vw | Ground | Ground |
| 280-3 | Vw | Vw | Vw | Vw | Ground | Ground |
| ... | Vw | Vw | Vw | Vw | Ground | Ground |
| 280-N/2 | Vw | Vw | Vw | Vw | Vw | Vw |

Figure 4:
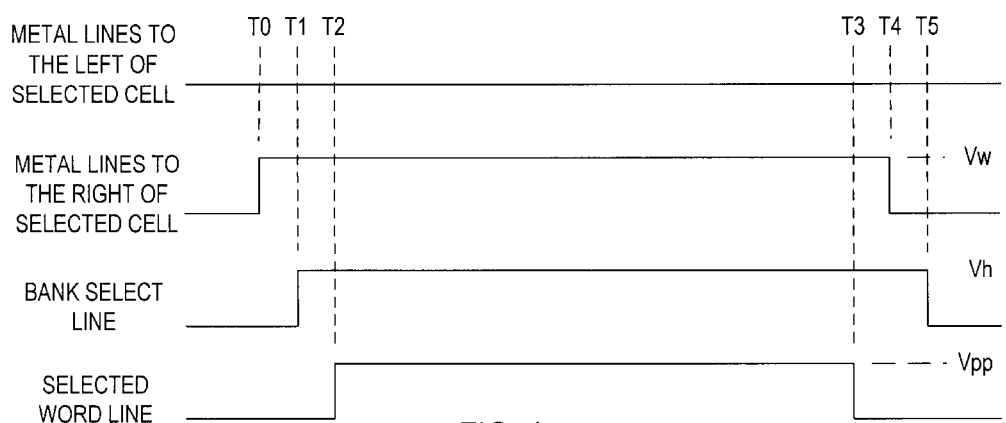
FIG. 4 is a timing diagram for signals employed during a programming operation in accordance with an embodiment of the invention.

The programming operations described above and illustrated in FIGS. 3A and 3B can proceed in an order and with a timing that minimizes or prevents current through unselected memory cells while word line programming voltage Vpp is being applied. FIG. 4 illustrates the timing of a programming operation that starts with all diffused lines 210, word lines 240, and metal lines 280 initially grounded. At a time T0, column decoders, drivers, and programming circuits drive the metal lines 280 that are to one side of the selected memory cell to programming voltage Vw. The metal lines 280 on the other side of the selected memory cell remain low at virtual ground VG. At the same time T0 or a slightly later time Ti, bank select logic asserts the select signal XA or XB that corresponds to the bank and the column containing the selected memory cell. The activated bank select signal is at a voltage Vh that is greater than programming voltage Vw by an amount at least as large as the threshold voltages of bank select cells 270 and 275.

Row decoders and drivers delay activating the selected word line until a time T2. The delay allows current through the activated bank select cells 270 or 275 to charge diffused lines 210 to the desired voltages (virtual ground VG or programming voltage Vw) before the activation of the selected word line. This reduces transient currents that might otherwise flow through unselected memory cells in the selected row while diffused lines charge to the appropriate voltages. This minimizes the possibility of spurious programming of unselected memory cells on the selected word line. Similarly, at the end of the programming operation, the selected word line drops to ground at a time T3 before metal lines 280 and bank select line 260 or 265 return to ground at respective times T4 and T5.

Read operations use bank select cells 270 or 275 in a similar manner for selection of a memory cell in an odd or even column of bank 200 during a programming operation. In particular, a read operation activates select signal XA to turn on column select cells 270 when reading a memory cell in an odd column or activates select signal XB to turn on column select cells 275 when reading a memory cell in an even column.

During a read operation, row decoders and drivers bias the selected word line 240 to a read voltage Vrr that is greater than the threshold voltage of an unprogrammed memory cell but less than the threshold voltage of a programmed memory cell. The row decoders ground the unselected word lines 240. Biasing of bank select line 260 and 265 and metal lines 280 for the read operation is essentially the same as in the programming operation except that the positive read voltages Vrr and Vr are lower than corresponding programming voltages Vpp and Vw.

Column decoders and VG/BL bias circuits ground the metal lines to one side of the selected column of memory cells and bias metal lines on the other side to a bit line read voltage Vr, typically less than 1 to 1.5 volts to avoid read disturb. The column decoder further connects a sense amplifier (not shown) to the selected metal line 280 that is at read voltage Vr and connected through a bank select cell 270 or 275 to the diffused line 210 that forms a drain region for the selected memory cell. Depending on its type, the sense amplifier senses current or a voltage drop of the metal line and generates an output signal indicating whether the selected memory cell is programmed or unprogrammed.

Only the selected memory cell is connected to the activated word line and has a voltage difference between its source/drain regions. Memory cells other than the selected memory cell that are connected to the activated word line have both source/drain regions at the same voltage (virtual ground VG or read voltage Vr) and do not conduct a current that would cause an error during the read operation. Accordingly, the presence or lack of current on the selected column or bit line depends solely on the threshold voltage state of the selected memory cell.

Typically, for an erase operation, a Flash memory erases one or more groups or sections of memory cells together, as a sector, by Fowler-Nordheim (F/N) tunneling of electrons out of the floating-gate through either the channel or source regions. A "negative-gate channel-erase" is preferred for the memory architecture of FIGS. 2A, 2B, and 2C. For the negative-gate channel-erase method, the word lines 140 are biased to a negative erase voltage, typically −10 to −12v, while P-well 206 and the deep N-well 204 are separately biased to 5–6 volts and at least 5–6 volts, respectively. The use of the negative-gate channel-erase eliminates the band-to-band tunneling current and associated ill effects that can arise with a "grounded-gate source-side erase". Additionally, the "negative-gate channel-erase" does not require drain junctions to differ structurally from source junctions, which results in minimum cell size.

The size of p-well 206 limits the number of memory cells that are simultaneously erased as a sector. One or more memory banks 200 can reside in the same p-well 206 to permit the simultaneous erasure of an entire bank or multiple banks of memory cells. To erase just selected rows of memory cells, one or more word lines 140 overlying the same p-well can be selectively biased to the negative erase voltage (−10 to −12 volts), while other unselected word lines 140 remain at near ground potential to avoid electrical erasure. With this architecture, a sector in memory 200 can be as small as a single row of a bank.

Figure 5:
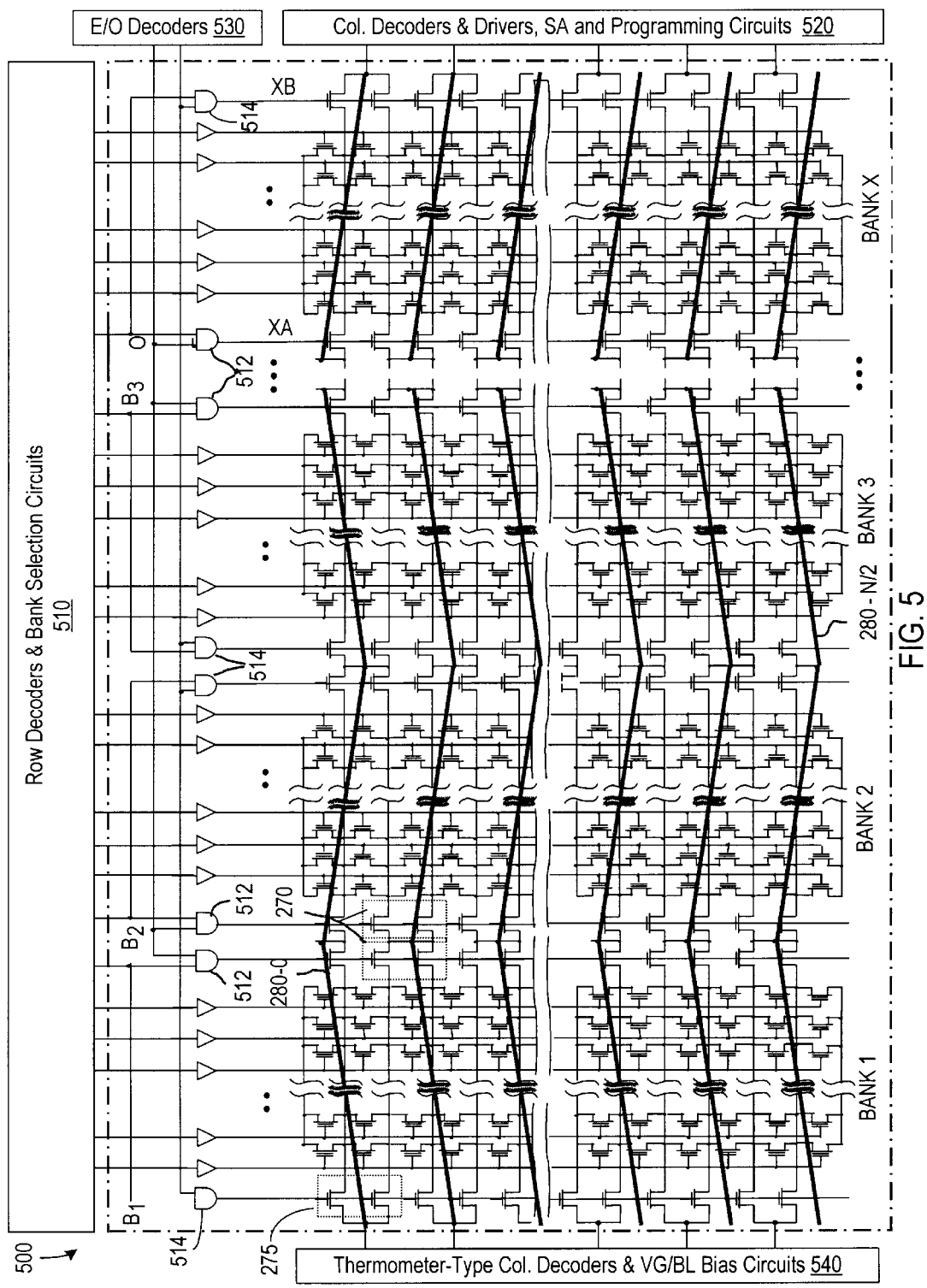
FIG. 5 is a block diagram of a contactless flash memory in accordance with an embodiment of the invention.

FIG. 5 illustrates a contactless Flash memory 500 in accordance with an embodiment of the invention. Contactless Flash memory 500 includes X banks that are similar or identical to bank 200. Metal lines 280 connect to each bank through contacts to bank select cells 270 and 275 in each bank. As shown in FIG. 5, the banks can be arranged in a mirror-symmetric fashion so that bank select cells 270 (or 275) for one bank shares a metal line contact structure with bank select cells 270 (or 275) in an adjacent bank.

For address decoding, contactless Flash memory 500 includes row decoder and bank selection circuits 510, column decoders 520, an even/odd decoder 530, and a thermometer-type column decoder 540.

Row decoding circuits 510 receive a row address signal, select a word line according to the row address signal, and drive the selected word line and unselected word lines as required for an access (write or read) of a selected memory cell. Additionally, row decoding circuits 510 activates one of the bank select signals B1 to BX according to which of the banks 1 to X contains the selected memory cell. Such row decoding circuits are well known for Flash memory and not described further here.

For activation of the appropriate select signal XA or XB, each bank includes a pair of AND gates 512 and 514, and each of the AND gate 512 and 514 has a corresponding one of bank select signals B1 to BX as an input signal. AND gates 512 have a signal O from even/odd decoder 530 as a second input signal, and gates 514 have a signal E from even/odd decoder 530 as a second input signal.

Even/odd decoder 530 activates signal O or E according to whether the selected memory cell is in an odd or even column of the array. In one embodiment, signal O is the least significant bit of the column address signal, and signal E has a level complementary to that of signal O. Accordingly, one of AND gates 512 activates signal XA in the selected bank when the selected memory cell is in an odd column, and one of AND gates 514 activates select signal XB in the selected bank when the selected memory cell is in an even column.

Column decoders 520 and thermometer-type column decoders 540 are both connected to metal lines 280, and both decode the column address signal. Generally, column decoders 520 are conventional circuits that select a metal line 280 according to the column address signal. Column decoders 520 connect a programming circuit to the selected metal line 280 for a write operation or a sense amplifier to the selected metal line 280 for a read operation.

Thermometer-type decoders 540 connect VG/BL bias circuits to bias metal lines to one side of selected column at one voltage (e.g., virtual ground VG) and bias metal lines 280 on the other side of the select column at another voltage (e.g., programming voltage Vw or read voltage Vr). Circuits that perform thermometer-type decoding are known in the art and can be implemented in a variety of ways. Thermometer-type decoders 540 could be located next to or integrated into the conventional column decoders 520 or could be located at the ends of metal lines 280 opposite the conventional column decoder 520 as shown in FIG. 5.

For write and read operations, column decoder circuits 520 receive a column address signal and connect the selected metal lines 280 to a programming circuit or a sense amplifier. At the same time, thermometer column decoders selectively bias metal lines 280 on one side of (e.g., to the below) the selected column to virtual ground VG, and metal lines 280 on the other side of (e.g., above) the selected column to a positive voltage Vw or Vr. As described above, banks having N columns of memory cells have 1+N/2 metal lines, and the column address not including the least significant bit identifies which of metal lines 280-1 to 280-N/2 is at the boundary between the metal lines biased at the positive voltage and the grounded metal lines.

As indicated above, embodiments of the invention provide compact memory cells for a contactless Flash memory by having memory cells between all adjacent pairs of diffused lines and using each diffused line as a virtual ground line or a bit line depending on which of the memory cells is being accessed. The effective size of memory cells including the overhead area required for bank select cells 270 and 275 can still be smaller than in conventional contactless Flash memory arrays because bank select cells serve as both bank select cells and as virtual ground devices, while conventional contactless Flash memories often include both bank select cells and virtual ground devices.

Although the invention has been described with reference to particular embodiments, the description is only an example of the invention's application and should not be taken as a limitation. For example, although the above embodiments employ lines and structures made of particular materials such as metal or silicon or particular conductivity types such as n or p, other materials or conductivity types are also suitable for use in embodiments of the invention. In particular, memory architectures in accordance with the invention can be applied in memories where the memory cells are p-channel devices. Additionally, although the above describes an embodiment of the invention where memory cells are a stacked-gate ETOX, CHE/FN cells, other embodiments include array of other types of memory cells such as split-gate memory cells, source side-injection Flash memory cells, EPROM cells, or event mask ROMs in which data bit are according to a threshold voltage (Vt) implant. Such memories can store one bit per cell, multiple bits per cell, or analog values depending on the accuracy at which threshold voltages of memory cells can be written, retained, and read. Various other adaptations and combinations of features of the embodiments disclosed are within the scope of the invention as defined by the following claims.

I claim:

1. A bank of a memory, comprising:
   a plurality of memory cells arranged in N columns, wherein N is greater than 2, each memory cell comprising a channel region in a substrate, a floating gate overlaying the channel region, and a control gate overlying the floating gate; and
   N+1 diffused lines, wherein each of the N columns of memory cells is between in adjacent pair of the N+1 diffused lines, portions of the adjacent pair of diffused lines forming source/drain regions of the memory cells in the column between the adjacent pair of bit lines
   a plurality of first bank select cells, each first bank select cell comprising a transistor between a corresponding adjacent pair of the diffused lines and contact to a corresponding metal line; and
   a plurality of second bank cells, each second bank select cell comprising a transistor between a corresponding adjacent pair of the diffused lines and contact to a corresponding one of the metal lines, wherein the adjacent pairs of diffused lines corresponding to the second bank select cells are offset relative to the adjacent pairs of diffused lines corresponding to the first bank select cells.

2. The bank of claim 1, further comprising an additional first bank select cell that connects to a single one of the diffused lines that is at one edge of the bank, and an additional second bank select cell that connects to a single one of the diffused lines that is at another edge of the bank.

3. A memory comprising:
   a plurality of diffused lines in a substrate and forming source/drain regions of memory cells; and
   a plurality of channel regions of the memory cells arranged in rows and columns, each of the channel being between an adjacent pair of the diffused lines;
   a plurality of the first bank selects that operate to electrically connect respective metal lines to respective first sets of the diffused lines; and
   a plurality of second bank select cells that operate to electrically connect the respective the metal lines to respective second sets of the diffused lines, wherein for each metal line, the respective second set of diffused lines differs from the respective first set of diffused lines.

4. The memory of claim 3, wherein the first sets of the diffused lines are offset relative to respective second sets of diffused bit lines.

5. The memory of claim 4, each of the first sets of the diffused lines is an adjacent pair of the diffused lines, and each of the second sets of the diffused lines is an adjacent pair of the diffused lines.

6. The memory of claim 3, further comprising a plurality of word lines overlying respective rows of the channel regions of the memory cells.

7. The memory of claim 6, wherein each of the memory cells further comprises a floating gate between the channel region of the memory cell and an overlying one of the word lines.

* * * * *